(12) United States Patent
Peitzsch

(10) Patent No.: US 8,004,817 B2
(45) Date of Patent: Aug. 23, 2011

(54) METHOD OF PLATEN FABRICATION TO ALLOW ELECTRODE PATTERN AND GAS COOLING OPTIMIZATION

(75) Inventor: Scott E. Peitzsch, Tewksbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 155 days.

(21) Appl. No.: 12/487,075

(22) Filed: Jun. 18, 2009

(65) Prior Publication Data

US 2010/0321856 A1    Dec. 23, 2010

(51) Int. Cl.
*H01T 23/00* (2006.01)
(52) U.S. Cl. .................................. 361/234; 361/230
(58) Field of Classification Search .................. 361/234, 361/230
See application file for complete search history.

(56) References Cited

U.S. PATENT DOCUMENTS 5,452,177 A * 9/1995 Frutiger ................... 361/234
5,822,172 A * 10/1998 White ....................... 361/234

* cited by examiner

*Primary Examiner* — Danny Nguyen

(57) ABSTRACT

An electrode pattern and layered assembly is disclosed. This assembly utilizes multiple-piece construction, including at least two electrically conductive layers and at least three electrically insulating layers. By incorporating a second electrically conductive layer, each electrode can be divided into two or more separate portions on the top layer, and joined together using the second conductive layer. Connections between the two conductive layers can be made using any suitable technique, including through-hole vias, conductive rods and the like. The use of a second electrically conductive layer also allows for a different gas distribution strategy. The use of multiple conductive layers allows the use of one or more concentric channels to be used through which the gas can be injected.

16 Claims, 15 Drawing Sheets

US 8,004,817 B2

METHOD OF PLATEN FABRICATION TO ALLOW ELECTRODE PATTERN AND GAS COOLING OPTIMIZATION

BACKGROUND OF THE INVENTION

Ion implanters are commonly used in the production of semiconductor wafers and other devices, such as solar cells. An ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits.

A block diagram of a representative ion implanter 100 is shown in FIG. 1. One skilled in the art will recognize that the ion implanter 100 is only one of many ion implanter designs. An ion source 110 generates ions of a desired species. In some embodiments, these species are atomic ions, which may be best suited for high implant energies. In other embodiments, these species are molecular ions, which may be better suited for low implant energies. These ions are formed into a beam, which then passes through a source filter 120. The source filter is preferably located near the ion source. The ions within the beam are accelerated/decelerated in column 130 to the desired energy level. A mass analyzer magnet 140, having an aperture 145, is used to remove unwanted components from the ion beam, resulting in an ion beam 150 having the desired energy and mass characteristics passing through resolving aperture 145.

In certain embodiments, the ion beam 150 is a spot beam. In this scenario, the ion beam passes through a scanner 160, which can be either an electrostatic or magnetic scanner, which deflects the ion beam 150 to produce a scanned beam 155-157. In certain embodiments, the scanner 160 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 1.

In an alternate embodiment, the ion beam 150 is a ribbon beam. In such an embodiment, there is no need for a scanner, so the ribbon beam is already properly shaped.

An angle corrector 170 is adapted to deflect the divergent ion beamlets 155-157 into a set of beamlets having substantially parallel trajectories. Preferably, the angle corrector 170 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 170, the scanned beam is targeted toward the workpiece 175. The workpiece is attached to a workpiece support. The workpiece support provides a variety of degrees of movement.

The workpiece support is used to both hold the wafer in position, and to orient the wafer so as to be properly implanted by the ion beam. Another critical function of the workpiece support is to provide cooling to the workpiece 175, as the workpiece may become hot during the implantation process. The workpiece support may be cylindrical in shape, such that its top surface is circular, so as to hold a disc-shaped wafer. Of course, other shapes are possible. To effectively hold the wafer in place, most workpiece supports typically use electrostatic force. By creating a strong electrostatic force on the upper side of the support, also known as the electrostatic chuck, the wafer can be held in place without any mechanical fastening devices. This minimizes contamination and also improves cycle time, since the wafer does not need to be unfastened after it has been implanted. These chucks typically use one of two types of force to hold the wafer in place: coulombic or Johnson-Rahbeck force.

As seen in FIG. 2, this chuck 200 traditionally consists of several layers. The first, or top, layer 210, which contacts the wafer, is made of an electrically insulating or semiconducting material, such as alumina, since it must produce the electrostatic field without creating a short circuit. In some embodiments, this layer is about 4 mils thick. For those embodiments using coulombic force, the resistivity of the top layer, which is typically formed using crystalline and amorphous dielectric materials, is typically greater than $10^{14}$ Ω-cm. For those embodiments utilizing Johnsen-Rahbeck force, the volume resistivity of the top layer, which is formed from a semiconducting material, is typically in the range of $10^{10}$ to 10 Ω-cm. The term "non-conductive" will be used to describe materials in either of these ranges, and suitable for creating either type of force. The coulombic force can be generated by an alternating voltage (AC) or by a constant voltage (DC) supply.

Directly below this layer is a layer of electrically conductive material 220, which contains the electrodes that create the electrostatic field. This layer is made using electrically conductive materials, such as silver. Patterns are created in this layer, much like are done in a printed circuit board to create the desired electrode shapes and sizes. FIG. 3 is a front plan view of a first embodiment of an electrode pattern for a platen. FIG. 4 is a front plan view of a second embodiment of an electrode pattern of a platen. Below this conductive layer 220 is a second insulating layer 230, which is used to separate the conductive layer 220 of the platen from the lower portion 240.

The lower portion 240 is preferably made from metal or metal alloy with high thermal conductivity to maintain the overall temperature of the chuck within an acceptable range. In many applications, aluminum is used for this bottom layer. In some embodiments, this bottom layer has two separate aluminum portions. The lower portion is thick and contains fluid passageways. Typically, the top surface of an aluminum block is machined to introduce channels 250 through which coolant is passed. The coolant can be any suitable fluid, including water and de-ionized water. A much thinner second aluminum plate is formed to act as a lid for this thicker aluminum block, providing a cover for these machined passageways. These two aluminum portions are bonded together to form the thermally conductive lower layer of the electrostatic chuck. This layer and the previously described electrically non-conductive layer are then mechanically affixed together, such as by epoxy, brazing material or other adhesive technique.

In addition to the fluid conduits that are used to cool the platen, there may be other conduits 260 used to carry gas to the top surface of the platen 200. These conduits are used to pump gas, known as backside gas, to the underside of the workpiece. This gas helps improve the thermal transfer between the workpiece and the platen.

FIG. 3 shows a top plan view of one embodiment of a platen 300. In this figure, six distinct electrodes 310, each in a spiraling shape, are visible, each separated from the others by a thin insulating boundary 315. The electrodes may be driven by a power supply, generating a three phase signal, such that there is a A+/A− pair, a B+/B− pair, and a C+/C− pair. During the first phase, the A+/A− pair is energized. During the second phase, the B+/B− pair is energized, and during the third phase, the C+/C− pair is energized. This continuous cycling of voltage around the platen 200 creates the electrostatic force needed to hold the workpiece clamped to the platen.

Located within the electrode pattern are a number of gas holes 320, which supply back side gas to the volume between the platen 300 and the workpiece. The gas cooling hole distribution is determined based on desired gas flow and pressure uniformity. Greater gas flow and pressure improves the uniformity of thermal transfer from the wafer to the platen which in turn improves temperature uniformity of the wafer. However, because the gas pressure tends to force the workpiece away from the platen 300, these gas holes 320 are typically located a distance away from the outer circumference of the platen 300, to insure sufficient electrode area exists to hold the workpiece to the platen. The pressure from the injected gas tends to force the workpiece away from the platen. By extending the electrodes beyond the gas holes, the outer edge of the workpiece is held down, thereby stopping the gas from escaping via the outer edge of the workpiece. Thus, the electrostatic forces created by the three electrode pairs counteracts the forces created by the introduction of back side gas.

FIG. 4 shows a top plan view of a second embodiment of an electrode pattern on a platen 400. As in FIG. 3, there are six distinct electrodes 410, arranged in three pairs, as described above. A number of gas holes 420 are arranged around the platen. A portion of the electrode pattern extends beyond the outer ring of gas holes to secure the outer edge of the workpiece to the platen.

While this configuration has been used for some time, there are a number of drawbacks associated with it. First of all, since there is only a single electrode layer in the platen, each of the six electrodes must be contiguous. In other words, the portion of the platen that is energized during any particular phase must be connected. This requirement leads to irregularly shaped electrode patterns, as can be seen in both FIG. 3 and FIG. 4. The reason for this is an attempt to balance this requirement with the need to spread the electrodes evenly across the platen to maximize the holding effect. Secondly, the gas flow to the underside of the workpiece may be less than optimal, due to the location constraints described above. It would therefore be beneficial if the electrodes could be separated into various non-connected portions to optimize their holding ability. Finally, it would be beneficial if the gas flow to the underside of the workpiece were improved.

SUMMARY OF THE INVENTION

The problems of the prior art are overcome by the electrode pattern and layered assembly described in the present disclosure. This assembly utilizes multiple-piece construction, including at least two electrically conductive layers and at least three electrically insulating layers.

By incorporating a second electrically conductive layer, each electrode can be divided into two or more separate portions on the top layer, and joined together using the second conductive layer. Connections between the two conductive layers can be made using any suitable technique, including through-hole vias, conductive rods and the like.

The use of a second electrically conductive layer also allows for a different gas distribution strategy. As described above, back side gas is delivered to the workpiece through a plurality of small holes, strategically placed about the platen. The use of multiple conductive layers allows the use of one or more concentric channels to be used through which the gas can be injected. In one embodiment, the second conductive layer is used to connect electrodes on either side of a concentric channel.

DETAILED DESCRIPTION OF THE INVENTION

Figure 1:
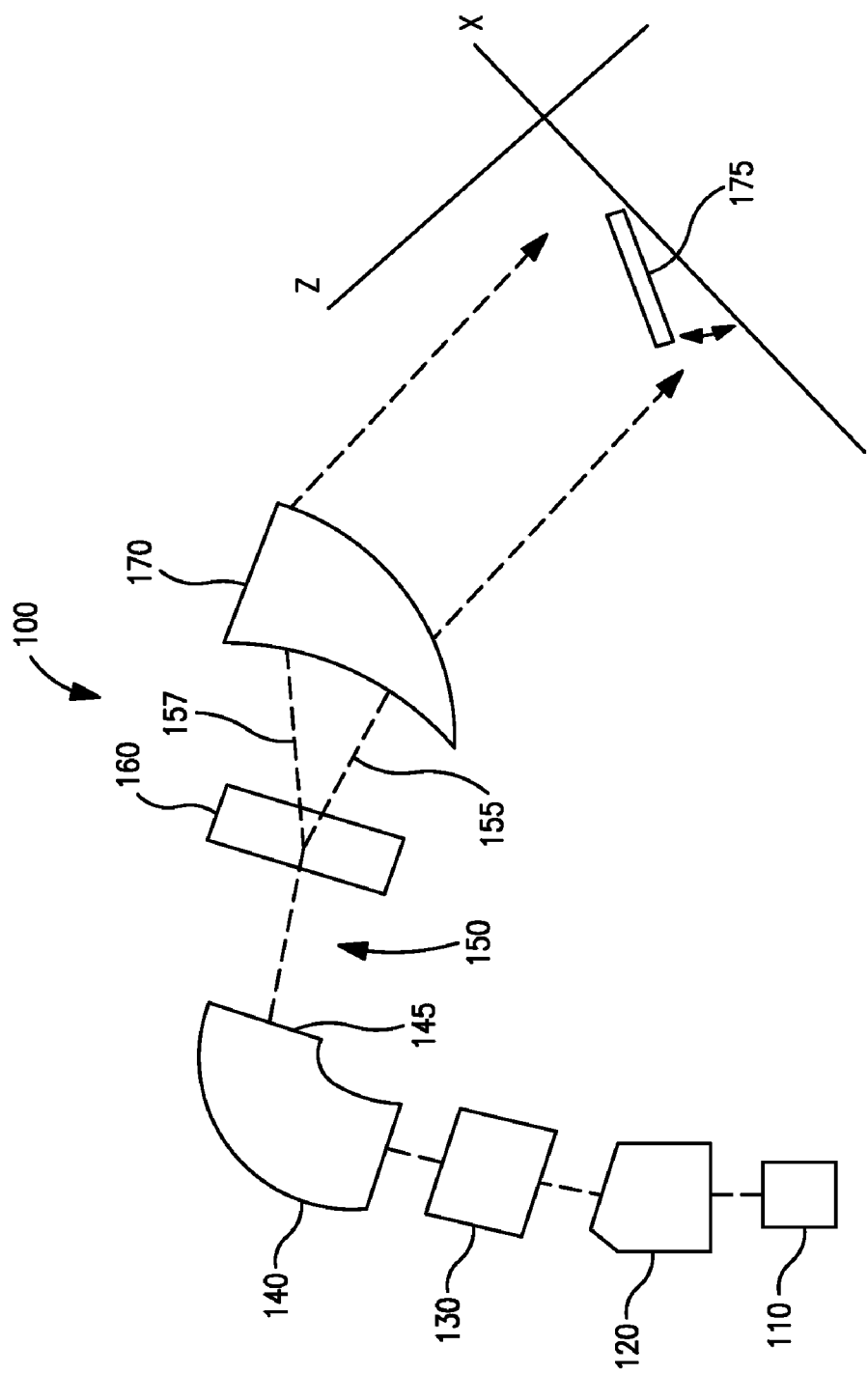
FIG. 1 represents a traditional ion implanter.
Figure 2:
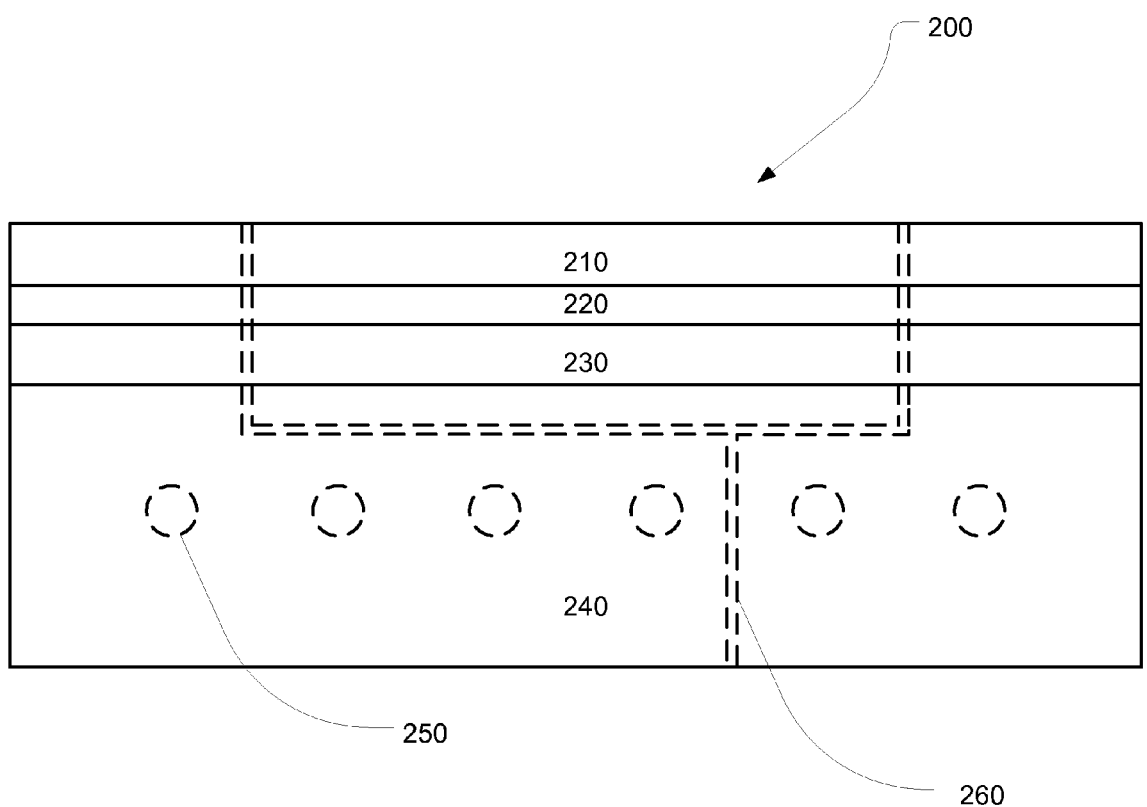
FIG. 2 represents a cross-sectional view of an electrostatic chuck of the prior art.
Figure 3:
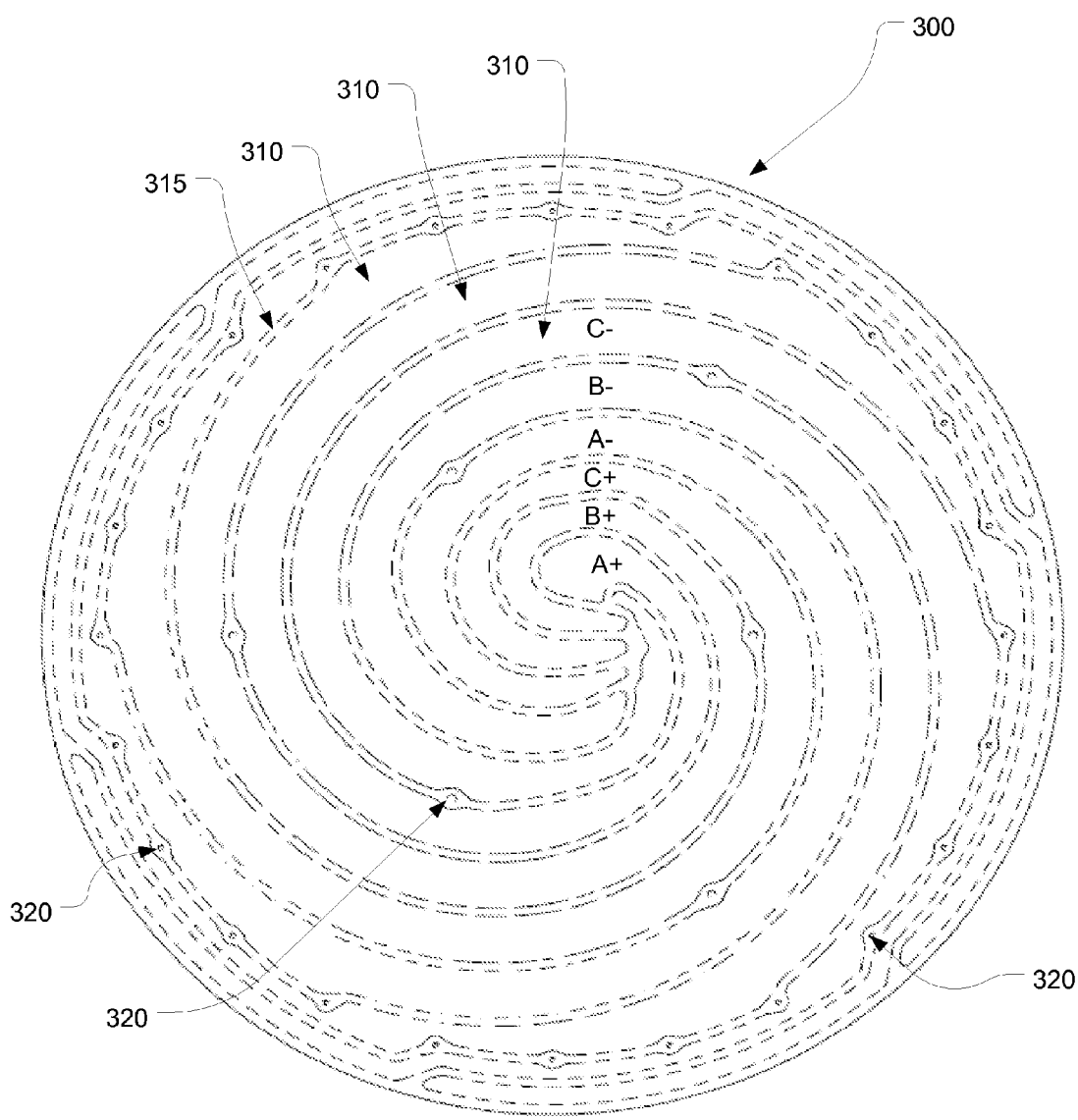
FIG. 3 represents a top plan view of a first embodiment of an electrode pattern.
Figure 4:
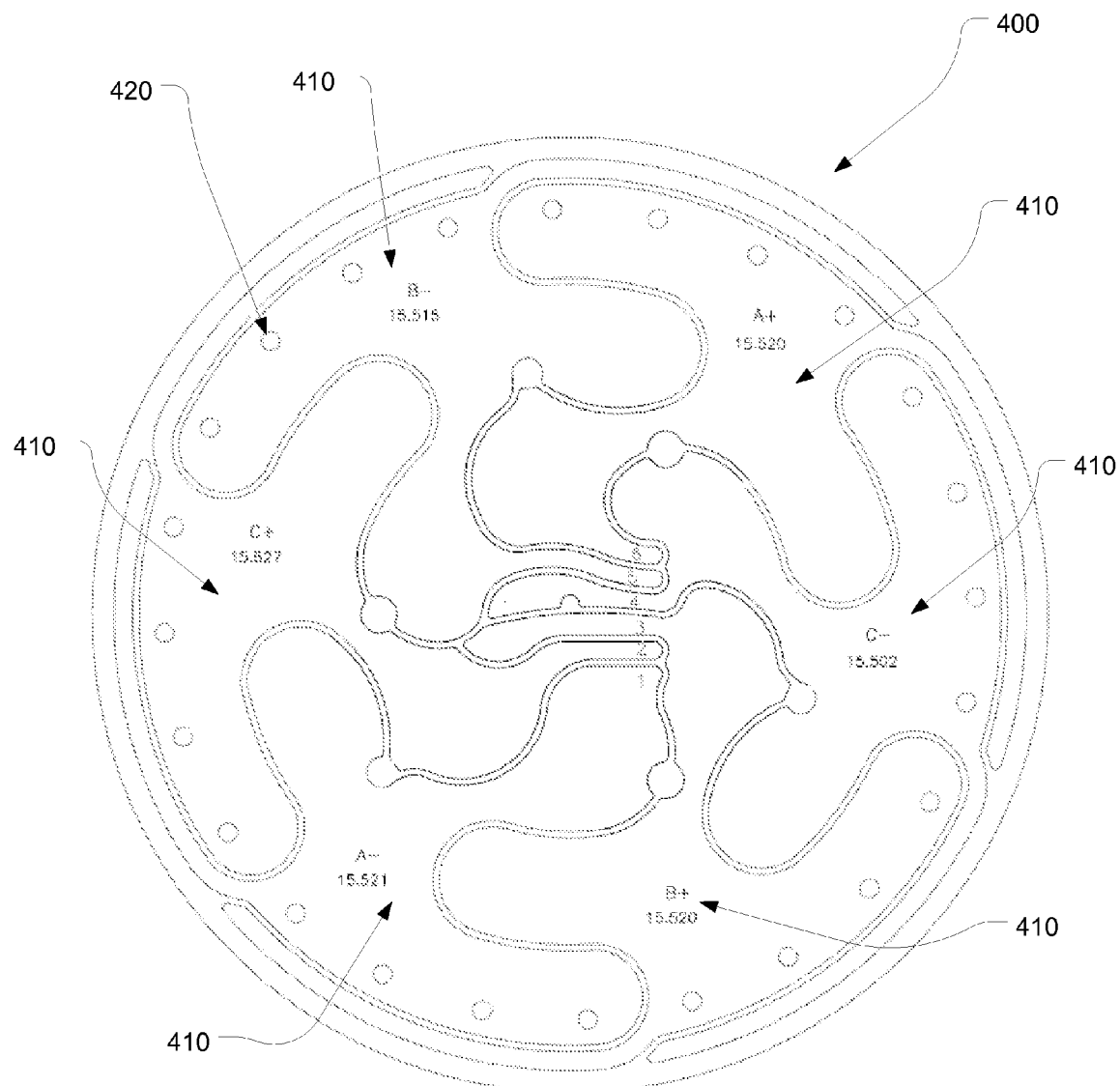
FIG. 4 represents a top plan view of a second embodiment of an electrode pattern.

As described above, electrostatic chucks (ESCs) have a top portion that has an electrically non-conductive top layer, and an electrically conductive layer beneath that, on which the electrode patterns are created. The use of a single conductive layer introduces serious limitation on the electrode design. The biggest such limitation is that each electrode must be contiguous, as there are no other conduits to connect separated portions. As described above, this limitation leads to unusually shaped electrodes, as shown in FIGS. 3 and 4.

Figure 5:
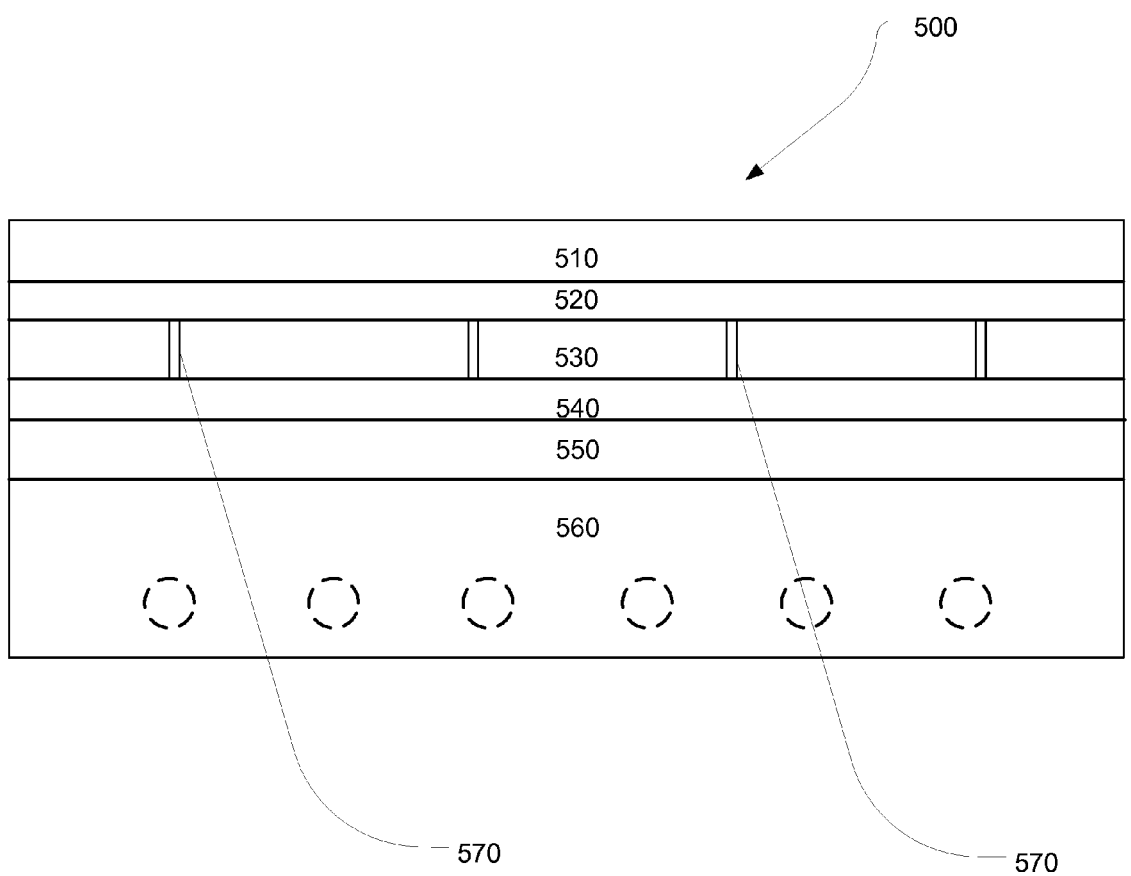
FIG. 5 represents a cross-sectional view of a first embodiment.

FIG. 5 shows a cross-sectional view of a first embodiment. As in the prior art, the ESC 500 has a top non-conductive layer 510 that contacts the workpiece. Beneath this top layer 510 is an electrically conductive electrode layer 520. This layer 520 contains the electrode pattern that creates the electrostatic field. A second insulating layer 530 is beneath the electrode layer 520. A second electrically conductive layer 540 is located beneath the second insulating layer 530. A third insulating layer 550 then separates the second electrically conductive layer 540 from the thermally conductive bottom portion 560 of the ESC 500. The electrically insulating layers 530, 550 are sufficiently thick so as to prevent electrical arcing between conductive layers. This thickness can be determined based on the dielectric constant of the insulating material, and the voltage differential between the conductive layers.

To utilize this second conductive layer 540, connections 570 must be made between it and the top electrode layer 520. These connections may be vertical between overlapping portions of the electrode layer 520 and the second conductive layer 540. This vertical connection can be formed in a number of ways. In one embodiment, a discontinuity, such as a hole, is made in the intervening insulating layer 530 between the two overlapping portions. This hole is then filled with a conductive material. In one embodiment, a metal based epoxy, such as silver epoxy, is used to fill the hole. In other embodiments, a metal rod of sufficient length to contact both conductive layers is inserted into the hole. Other methods of creating a conducting path through the insulating layer are also known in the art.

Figure 6:
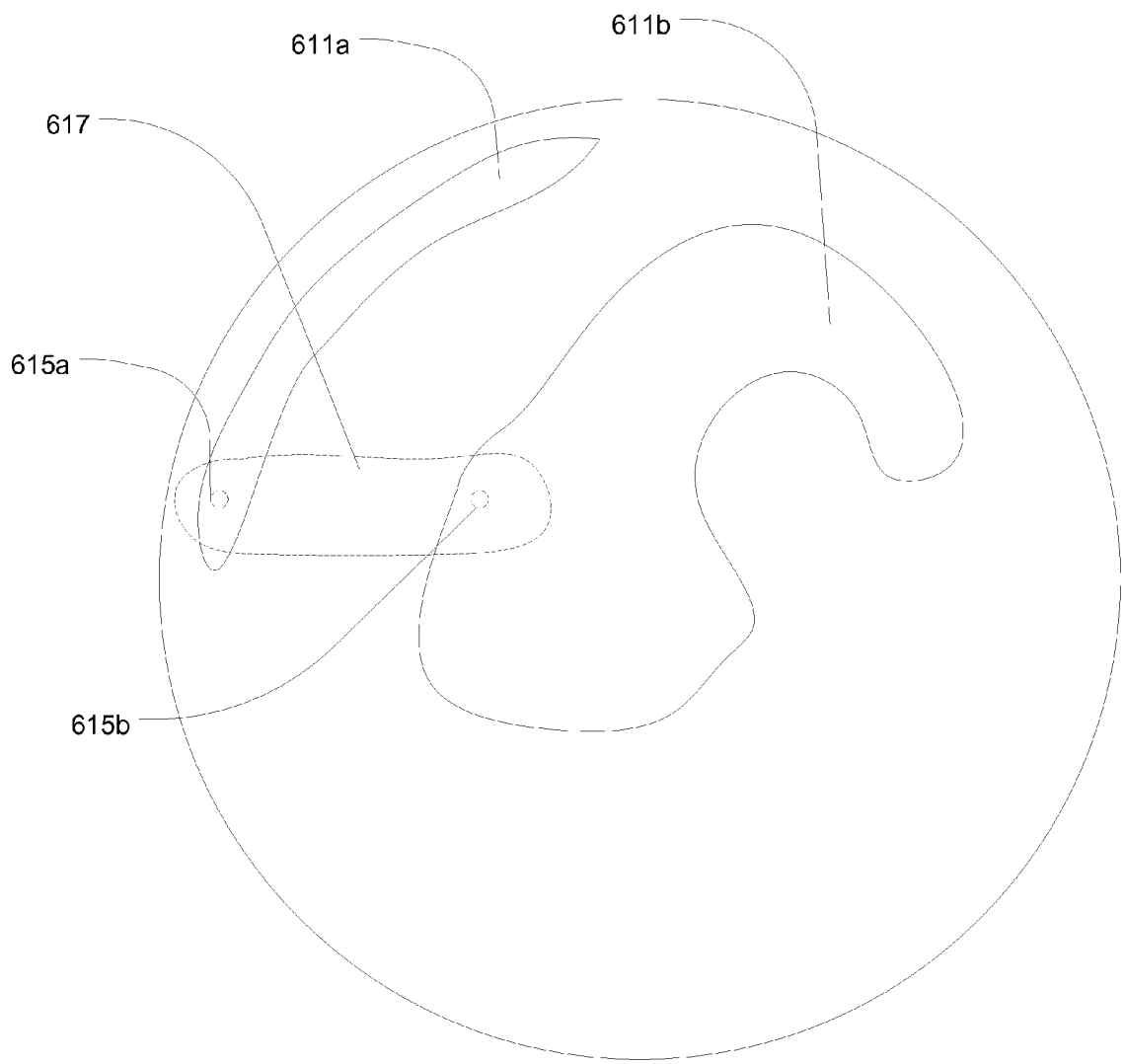
FIG. 6 represents a top view showing the interaction between the various layers.
Figure 7A:
FIGS. 7a-c show the various layers on the ESC shown in FIG. 6.
Figure 7B:
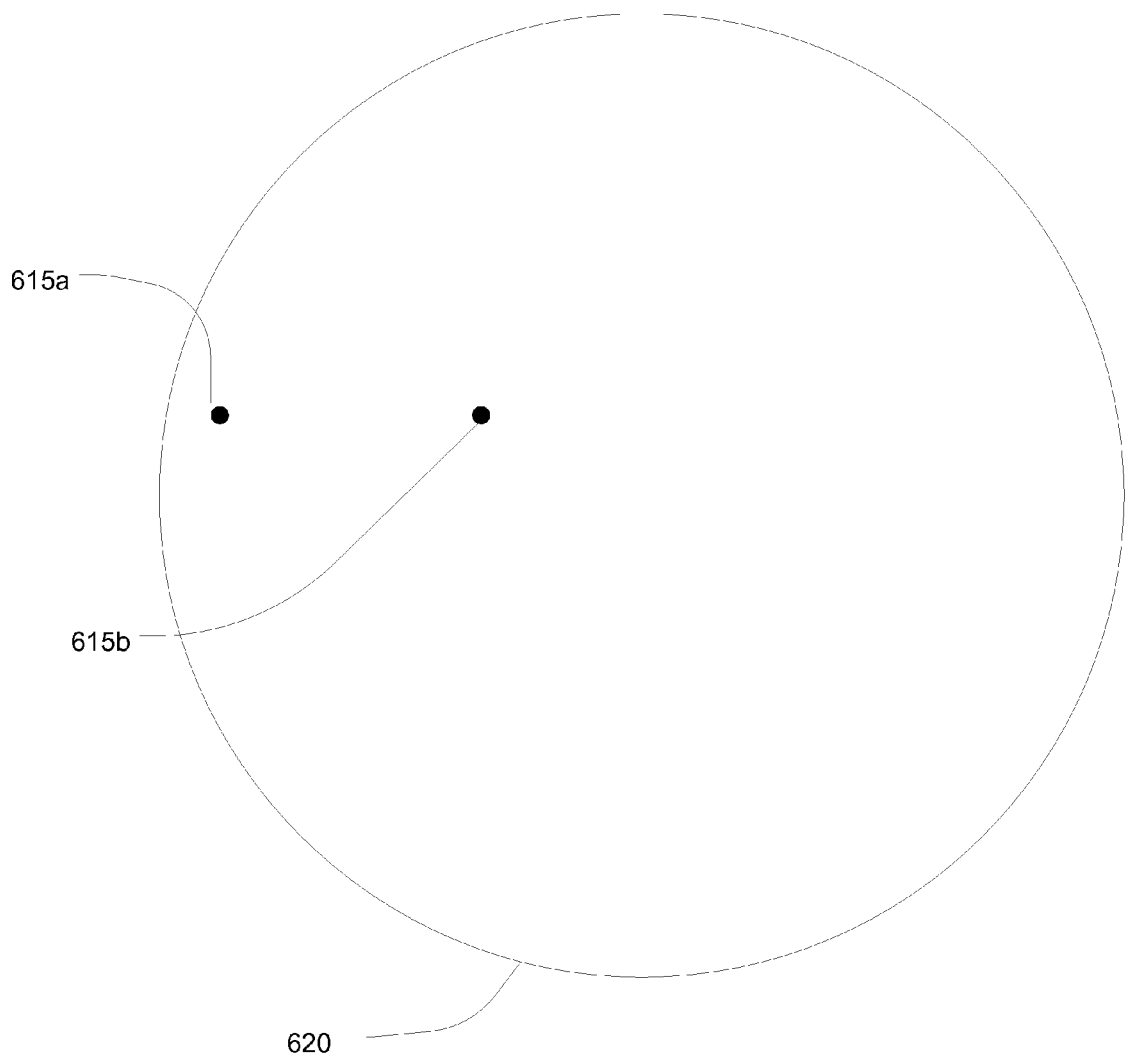
Figure 7C:
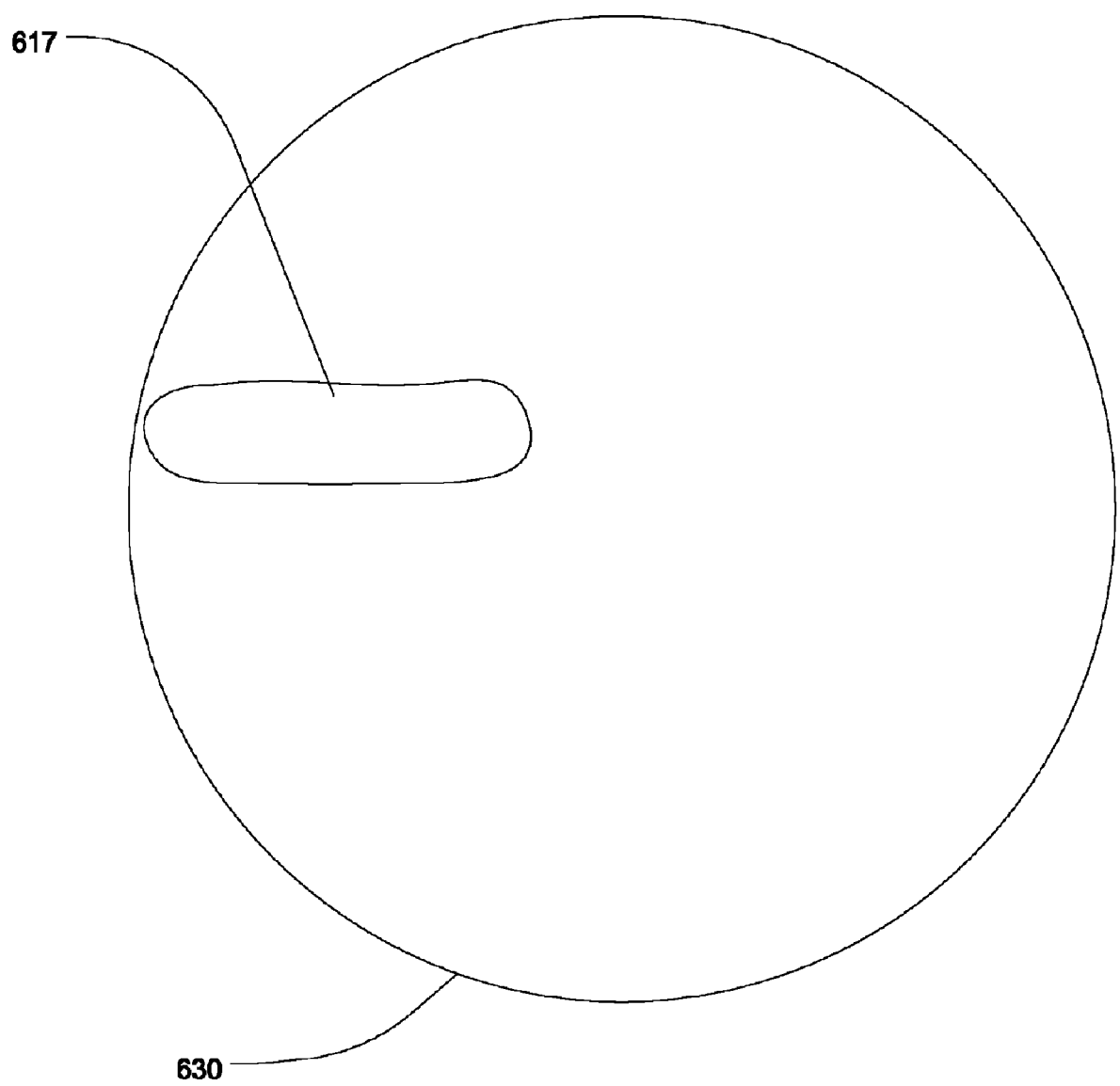

FIG. 6 shows an example of the use of a second conductive layer to bridge two separate electrode portions. The top electrode layer 610 is shown in solid lines, while the underlying vertical connections, and second conductive layer are shown in dotted lines. Top electrode layer 610 has two electrode patterns 611a, 611b which are part of the same electrode. However, due to other constraints, these two patterns cannot be joined on the top electrode layer 610. Therefore, vertical connections 615a, 615b are made through the insulating layer. The two electrode patterns 611a, 611b are then connected using the second electrically conductive layer, using a conductive path, or trace 617. FIGS. 7a-c show an exploded view of each layer shown in FIG. 6. FIG. 7a shows the electrode layer 610, where the two electrode patterns 611a, 611b are formed. FIG. 7b shows the insulating layer 620. This is a solid layer, with the exception of the discontinuities that are used to connect electrode layer 610 to second conductive layer 620. To connect the electrodes 611a, 611b, two through holes, or vias, 615a, 615b are drilled; one 615a directly beneath the first electrode pattern 611a and the second 615b directly beneath the second electrode pattern 611b. FIG. 7c shows the second conductive layer 620. This layer has a trace 617 that connects vertical connections 615a, 615b together. When these layers are assembled, the connection is made between electrode patterns 611a, 611b.

While the connections between the two conductive layers are described as being vertical, this is not the only embodiment. The holes may be drilled at an angle if desired. Additionally, the discontinuities through the insulating layers do not need to be holes. Furthermore, while two conductive layers 610, 630 are described herein, embodiments have additional conductive layers are also within the scope of the disclosure. Additional insulating and conductive layers can be stacked together as required to connect the various electrode patterns.

Figure 8A:
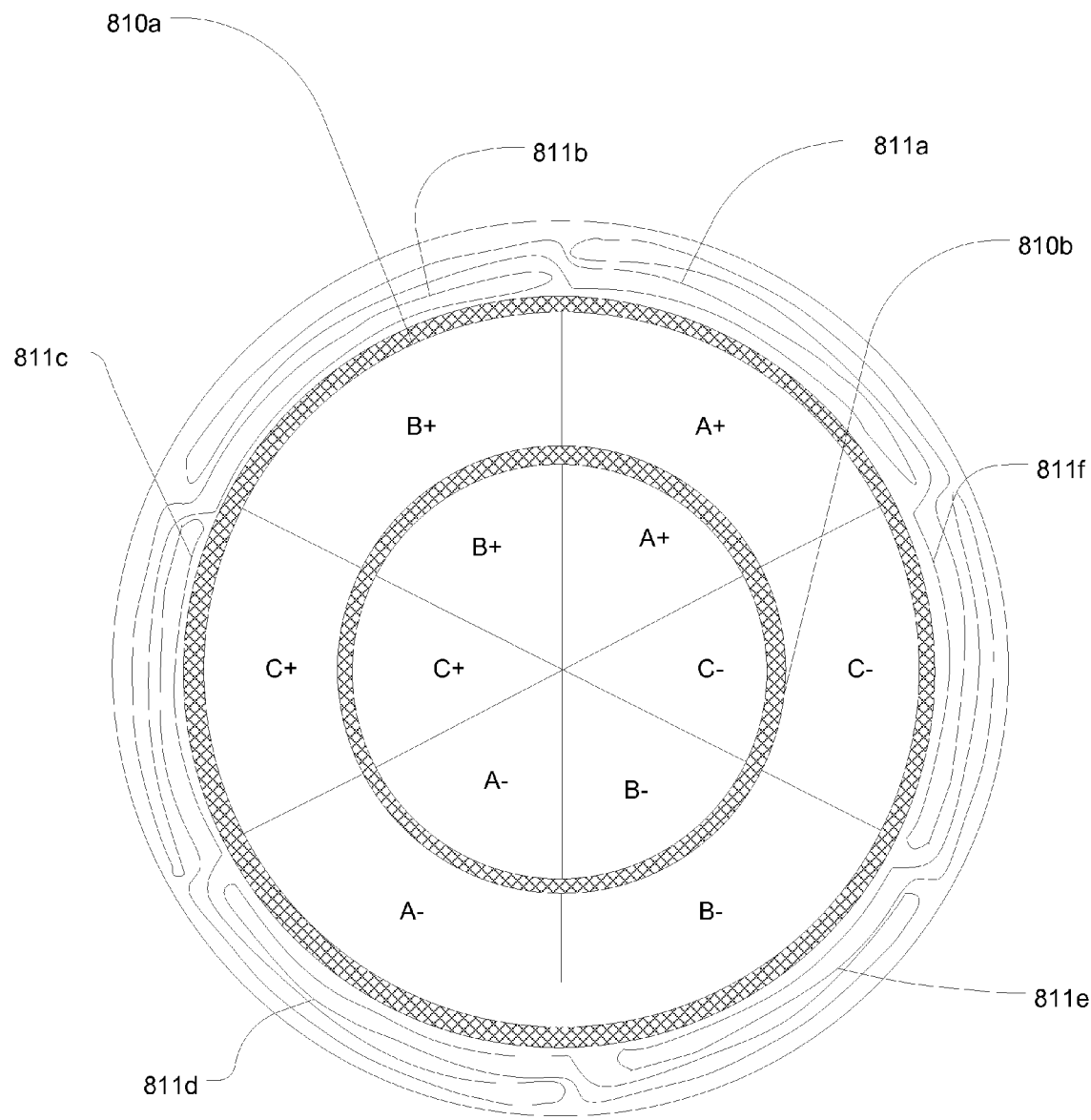
FIGS. 8a-d show the various layers of a second embodiment.

As explained above, the use of multiple conductive layers allows non-contiguous electrode patterns to be used. In addition, it allows the use of gas channels, rather than gas holes. FIG. 8a shows a top view of an ESC, having two concentric channels 810a, 810b through which back side gas is injected. These gas channels may be continuous at the surface of the ESC. In other words, the channel forms a closed loop embedded in or through one or more layers. In some embodiments, these channels are circular, and form concentric circles with respect to the platen, which is also typically circular. Inside the outer concentric channel 810a, the electrodes are arranged as sectors. The electrodes are energized in a sequence as shown in FIG. 8a. In this embodiment, the electrodes are energized such that the A pair is energized during one phase of the electrical signal; the B pair is energized during a second phase of the electrical signal and the C pair is energized during a third phase. The electrodes outside the outer concentric channel 810a are arranged such that each electrode covers approximately one third of the outer circumference. This arrangement helps maximize the holding force, thereby reducing the amount of gas that escapes via the outer edges. In this embodiment, electrode 811a and electrode 811d are the electrodes associated with the A phase. Similarly, electrode 811b and electrode 811e are associated with the B phase, while electrode 811c and 811f are associated with the C phase. Due to the shape of these outer electrodes, approximately ⅔ of the circumference is energized at any point in time. However, due the flexibility afforded through the use of a second electrically conductive layer, it may be possible to energized nearly all of the circumference at any point in time.

Figure 8B:
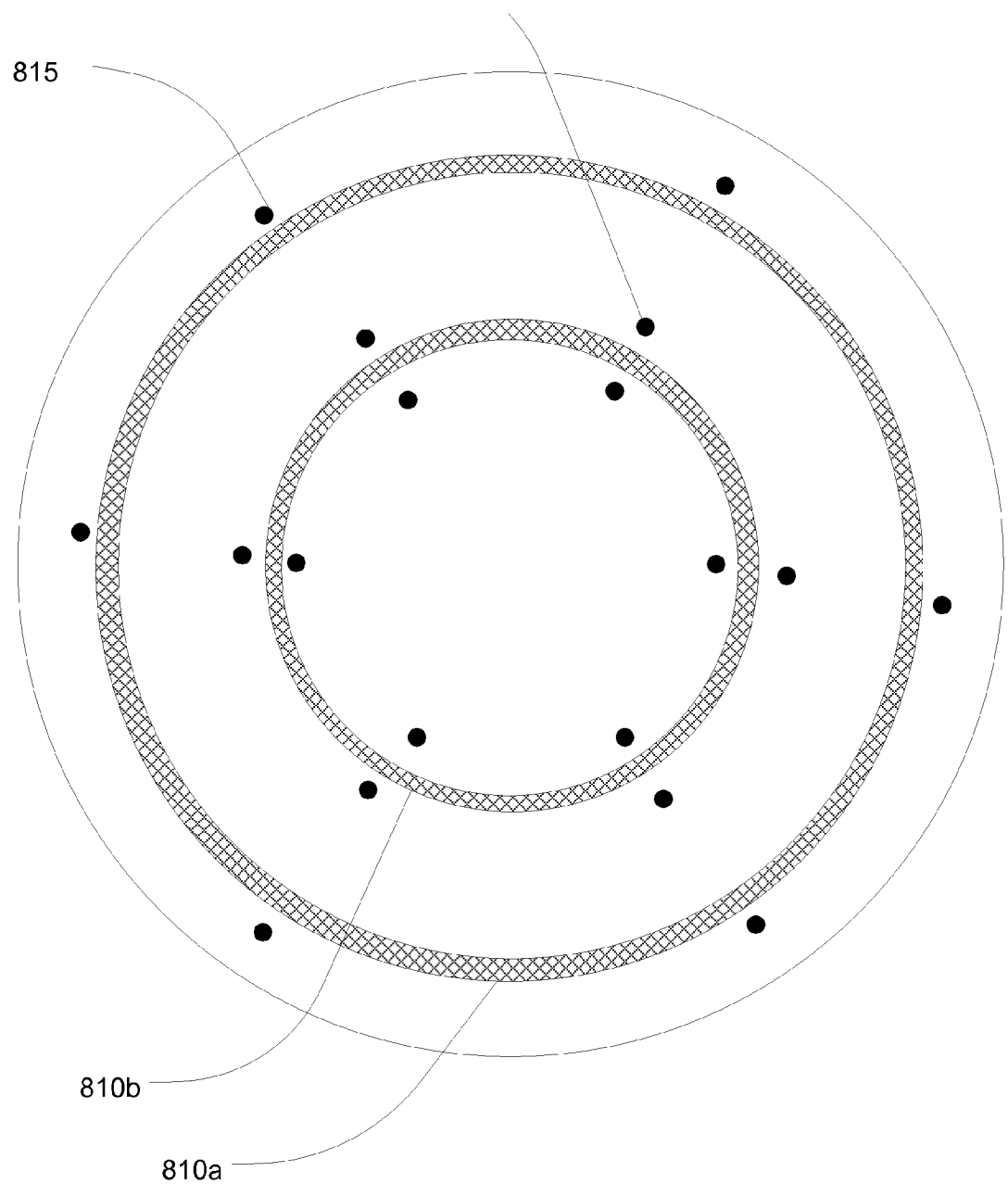

FIG. 8b is a top view of the insulating layer. The holes 815 in the insulating layer serve as through holes, or vias, for vertical connections between the top layer and the second conductive layer. The concentric rings 810a, 810b represent areas in which the insulating layer is reduced in thickness. A cross-sectional view of the ESC is shown in FIG. 9.

Figure 8C:
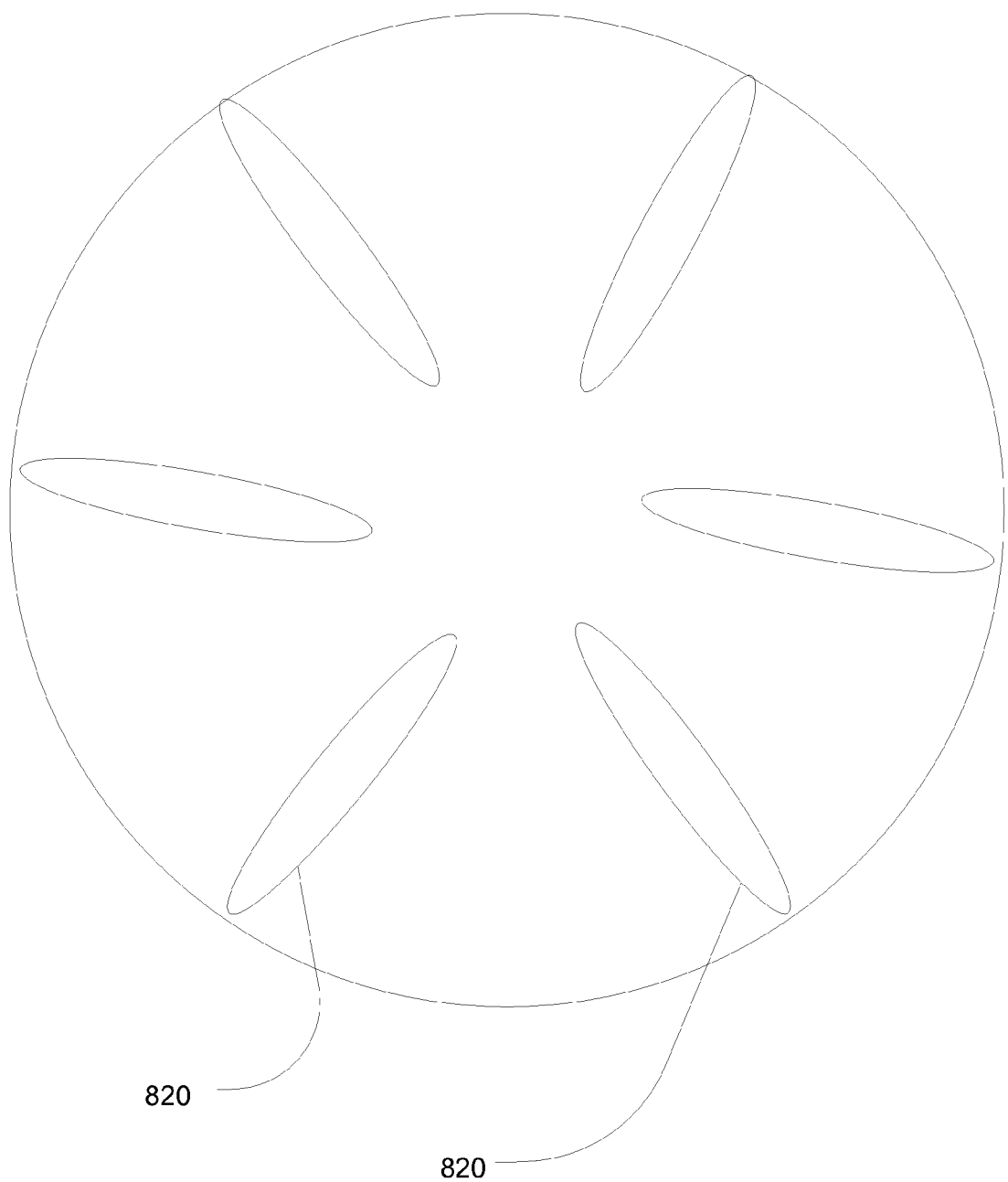

The second conductive layer, shown in FIG. 8c, allows the electrodes, which are separated by the gas channels, to be electrically connected. In this embodiment, six traces 820 are used to connect the various separated portions on the top electrode layer together.

Figure 8D:
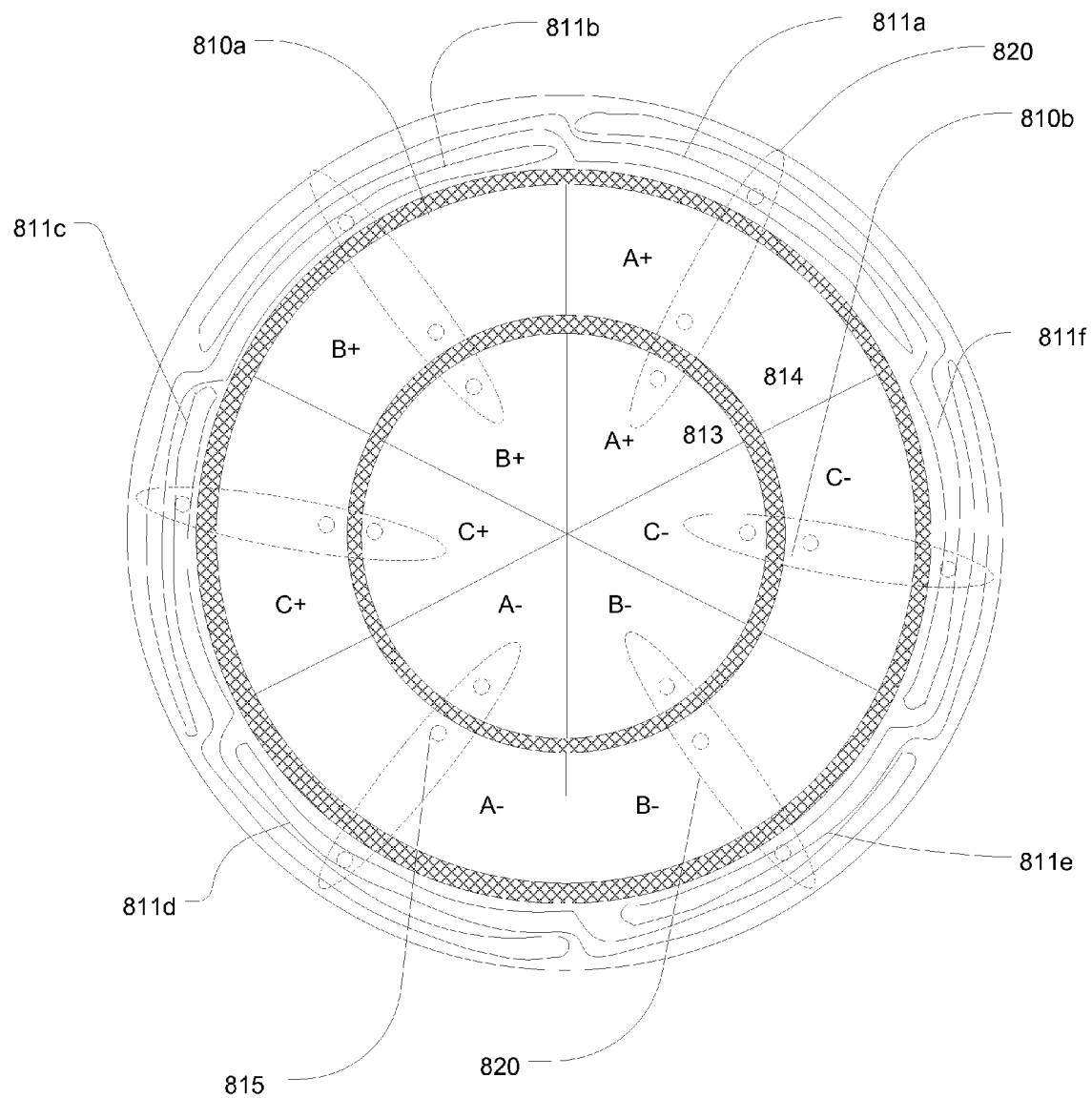

FIG. 8d shows the three layers superimposed on one another so that the electrical connections between layers can be seen. Dotted lines represent the traces 820 that exist on the second conductive layer. Note that the voltage may be made available around the inner six sectors. Each of these sectors is connected to a corresponding trace 820 on the second conductive layer through one or more through holes or connection points 815. For example, inner sector 813 is connected to outer sector 814 using a trace 820 located on the second. Similarly, these two sectors 813, 814 are connected to outer electrode 811a via a trace 820 located on the second conductive layer. Similar connections are provided for the remaining five electrodes. While this embodiment shows a single trace 820 being used for an electrode, other embodiments are also within the scope of the disclosure. For example, one trace may be used to connect inner sector 813 to outer sector 814, while a second trace is used to connect outer sector 814 to outer electrode 811a.

Figure 9:
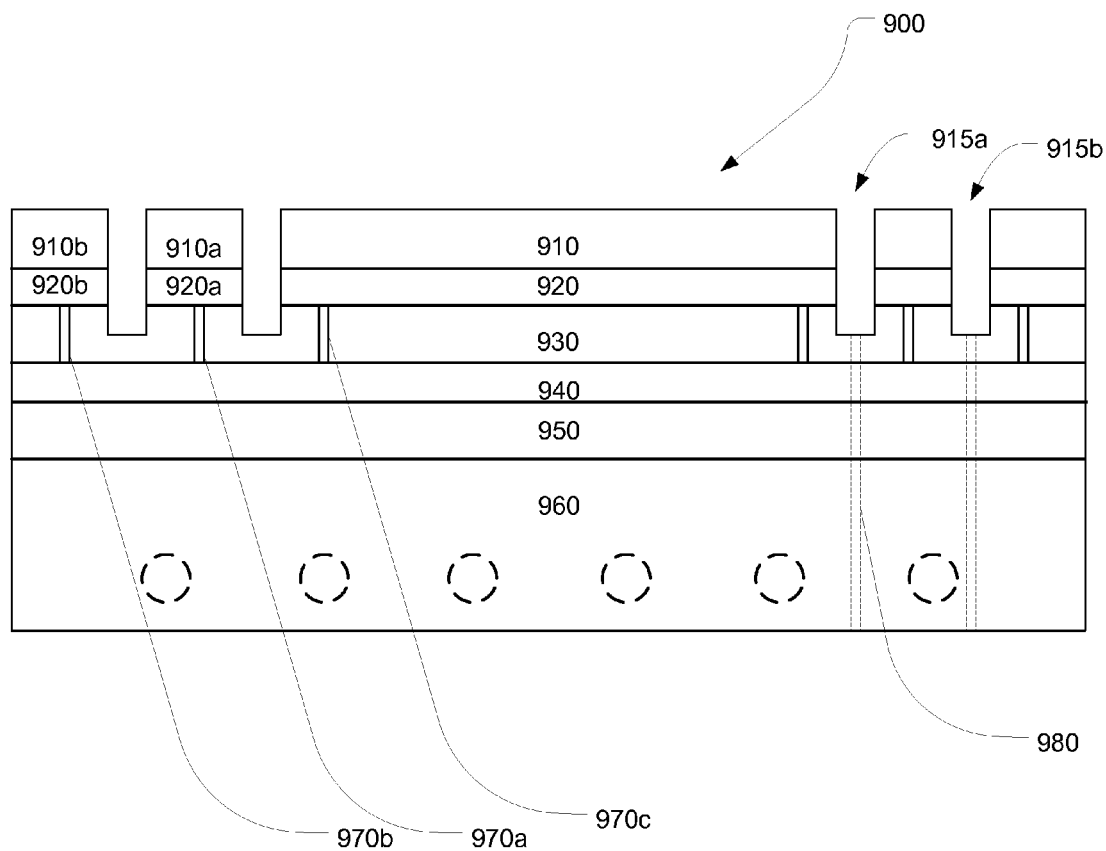
FIG. 9 represents a cross-section of the embodiment of FIG. 8.

FIG. 9 shows a cross section of the ESC 900 of FIG. 8d. In this embodiment, the gas channels 915a, 915b are created so as to cut completely through the top insulating layer 910 and the top electrode layer 920, and cut into an upper portion of the second insulating layer 930. In this embodiment, these channels 915 separate the top electrode layer into three portions, inner circular portion 920, a first ring or annulus 920a, and an outer ring or annulus 920b. Vertical connectors 970b connects outer ring 920b to the second conductive layer 940. Vertical connectors 970a connects first ring 920a to the second conductive layer 940, vertical connectors 970c connects the inner circular portion 920 to the second conductive ring 940. In one embodiment, a sufficient thickness of insulating material in layer 930 is left beneath so that voltage from the second conductive layer 940 cannot arc through the gas channel 915 to the workpiece or to the electrode layer 920. While two gas channels are depicted in this Figure, the disclosure is not limited to this embodiment. One channel may be used, or more than two channels can be employed if desired. The mechanism by which the electrodes are connected remains the same in all instances.

Figure 10:
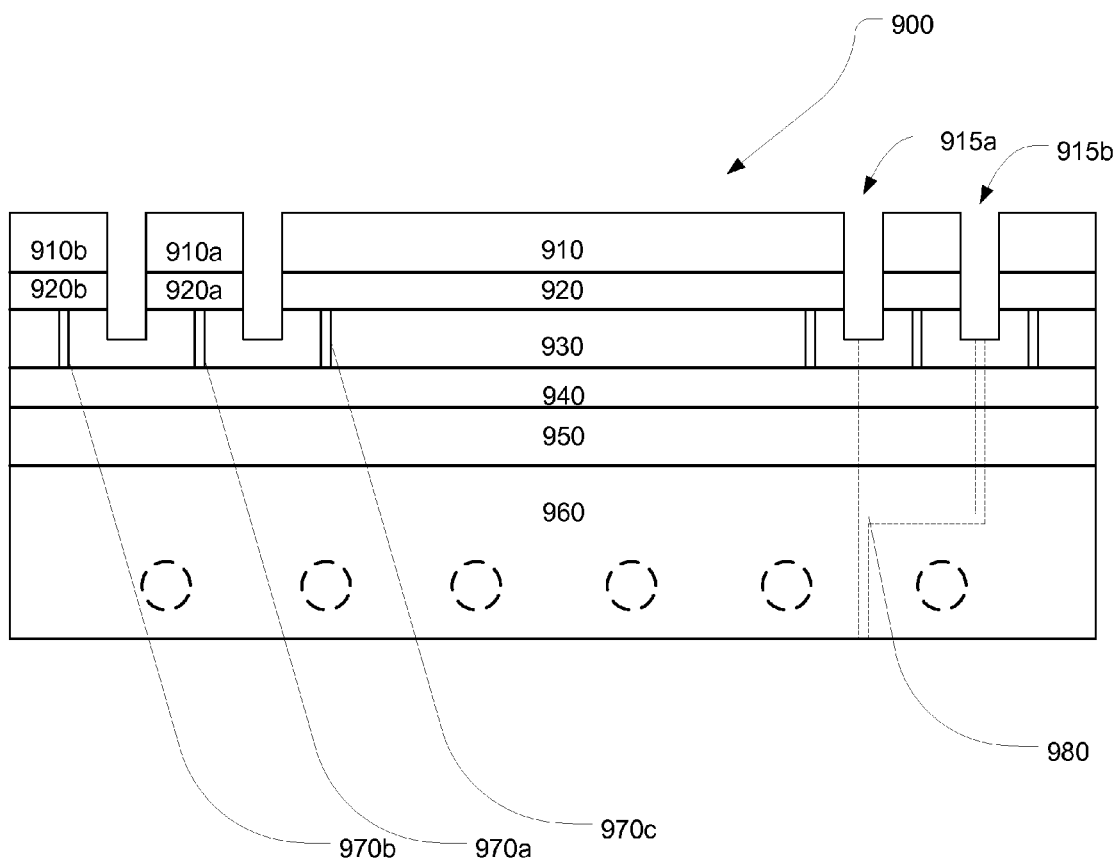
FIG. 10 represents a cross-section of a second embodiment of FIG. 8.

Conduits 980 are shown connecting the gas channels 915 to the bottom of the platen 900. In some embodiments, multiple conduits are used to supply gas to each channel, such as on opposite sides of the ring, or equally spaced around the ring. In other embodiments, a single conduit reaches the bottom of the platen 900. This conduit then branches to supply gas to both channels. An example of this is shown in FIG. 10.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of an electrostatic chuck in ion implantation applications, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A layered assembly, comprising:
    a top electrically non-conductive layer, adapted to contact a workpiece;
    a first electrically conductive layer, comprising a pattern of electrodes, adapted to create an electrostatic force to hold said workpiece in place, located beneath said top electrically non-conductive layer;
    a second electrically conductive layer; and
    a second electrically non-conductive layer, located beneath said first electrically conductive layer, comprising a plurality of vias to electrically connect said first electrically conductive layer to said second electrically conductive layer, said second electrically conductive layer located beneath said second electrically non-conductive layer.

2. The layered assembly of claim 1, whereby said vias comprises discontinuities in said second electrically non-conductive layer.

3. The layered assembly of claim 2, whereby electrically conductive material is located within said discontinuities.

4. The layered assembly of claim 1, wherein said pattern of electrodes comprises three pairs, wherein each of said three pairs is energized during a different phase of an applied voltage.

5. The layered assembly of claim 4, further comprising a power supply in communication with said pattern of electrodes.

6. The layered assembly of claim 5, wherein said power supply supplies three phase power to said pattern of electrodes.

7. The layered assembly of claim 1, further comprising a channel through which a gas is pumped toward the volume beneath said top electrically non-conductive layer and said workpiece.

8. The layered assembly of claim 7, wherein said channel is deeper than the combined thickness of said top electrically non-conductive layer and said first electrically conductive layer.

9. The layered assembly of claim 8, wherein said channel divides said first conductive layer into two non-contiguous, portions.

10. The layered assembly of claim 7, wherein said layered assembly is cylindrical and said channel divides said first electrically conductive layer into an inner circular portion and an outer ring.

11. An electrostatic chuck comprising:
    a top electrically non-conductive layer, adapted to contact a workpiece;
    a first electrically conductive layer located beneath said top electrically non-conductive layer, comprising a plurality of electrodes, each in communication with one of a plurality of outputs of a multiphase power supply, wherein more than one of said electrodes is in communication with one of said outputs; and
    a second insulating layer beneath said first electrically conductive layer and a second conductive layer beneath said second insulating layer, wherein said second conductive layer comprises a plurality of conductive paths, whereby two of said electrodes are in communication with one of said conductive paths on said second conductive layer.

12. The electrostatic chuck of claim 11, wherein said multiphase power supply comprises three pairs of phased outputs.

13. The electrostatic chuck of claim 11, wherein said first electrically conductive layer comprises a gas channel which separates said first electrically conductive layers into two portions.

14. The electrostatic chuck of claim 13, wherein said chuck comprises a circular shape, and said channel is a concentric circle, dividing said first electrically conductive layer into an inner circle and an outer ring.

15. The electrostatic chuck of claim 14, wherein an electrode in said inner circle is in communication with an electrode in said outer ring via one of said conductive paths.

16. An electrostatic chuck comprising:
    a top electrically non-conductive layer, adapted to contact a workpiece;
    a first electrically conductive layer, comprising a pattern of electrodes, adapted to create an electrostatic force to hold said workpiece in place, located beneath said top electrically non-conductive layer;
    a gas channel formed as a continuous loop, which divides said first electrically conductive layer into a first portion and a second portion, such that a portion of said electrodes are located in each of said first portion and said second portion; and
    a second insulating layer beneath said first electrically conductive layer and a second conductive layer beneath said second insulating layer, wherein said second conductive layer comprises a plurality of conductive paths, where an electrode in said first portion of said first electrically conductive layer is in communication with an electrode in said second portion of said first conductive layer via one of said conductive paths.

* * * * *